(12) United States Patent
Peng et al.

(10) Patent No.: US 8,453,985 B2
(45) Date of Patent: Jun. 4, 2013

(54) MOUNTING DEVICE FOR FIXING PERIPHERAL DEVICE TO SERVER

(75) Inventors: Wen-Tang Peng, Tu-Cheng (TW); Xin-Hu Gong, Shenzhen (CN); Ju-Wen Dai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 228 days.

(21) Appl. No.: 13/104,026

(22) Filed: May 10, 2011

(65) Prior Publication Data

US 2012/0145855 A1 Jun. 14, 2012

(30) Foreign Application Priority Data

Dec. 9, 2010 (CN) .......................... 2010 1 0580864

(51) Int. Cl.
*A47B 96/06* (2006.01)
*E04G 5/06* (2006.01)

(52) U.S. Cl.
USPC .............. 248/231.85; 248/226.11; 248/228.5; 248/231.61; 248/918; 361/679.31; 361/796

(58) Field of Classification Search
USPC .................... 248/226.11, 918, 228.5, 231.61, 248/231.85; 361/679.32, 679.31, 796, 801, 361/804
See application file for complete search history.

(56) References Cited

U.S. PATENT DOCUMENTS

| | | | | | |
|---|---|---|---|---|---|
| 2,986,366 | A | * | 5/1961 | Wesson | 248/285.1 |
| 4,579,311 | A | * | 4/1986 | Spranza, III | 248/553 |
| 5,039,044 | A | * | 8/1991 | Sher | 248/125.1 |
| 5,292,099 | A | * | 3/1994 | Isham et al. | 248/442.2 |
| 5,683,066 | A | * | 11/1997 | McCann | 248/295.11 |
| 5,961,084 | A | * | 10/1999 | Brand et al. | 248/248 |
| 6,340,145 | B1 | * | 1/2002 | Tagami et al. | 248/317 |
| 8,141,836 | B2 | * | 3/2012 | Saez et al. | 248/317 |
| 2008/0000850 | A1 | * | 1/2008 | Peng et al. | 211/41.17 |

* cited by examiner

*Primary Examiner* — Anita M King
(74) *Attorney, Agent, or Firm* — Altis Law Group, Inc.

(57) ABSTRACT

A mounting device includes a clamping device, a spacing device, and a receiving device. The clamping device includes an upper clamping element and a lower clamping element. The upper clamping element includes a first side plate and an upper clamping plate, the first side plate defines a guiding element and a number of position holes thereon thereon. The lower clamping element includes a second side plate received in the guiding element and a lower clamping plate opposite to the upper clamping plate. The second side plate defines a spacing hole therethrough. The spacing device is positioned on the first side plate and extends outward a position pole, the poison pole penetrates the position hole and receives in the spacing hole for fixing the lower clamping element. The receiving device is rotatably connected with the first side plate and defines a receiving room.

11 Claims, 6 Drawing Sheets

MOUNTING DEVICE FOR FIXING PERIPHERAL DEVICE TO SERVER

BACKGROUND

1. Technical Field

The present disclosure relates to mounting devices, and particularly, to a mounting device that can be secured on servers with different sizes and support peripheral devices used with the servers.

2. Description of Related Art

CD drives are assembled in servers as standard accessories, but the CD drives may not be used often. Therefore, in a server room or data center where there are many servers in use, having a CD drive for each one is wasteful. Although some CD drives may be attached on an outer surface of a server and used with many servers, the mounting means usually can only fit one size of server and so is still not convenient.

Therefore, it is desirable to provide a mounting device which can overcome the limitations described.

DETAILED DESCRIPTION

Embodiments of the disclosure will now be described in detail, with reference to the accompanying drawings.

Figure 1:
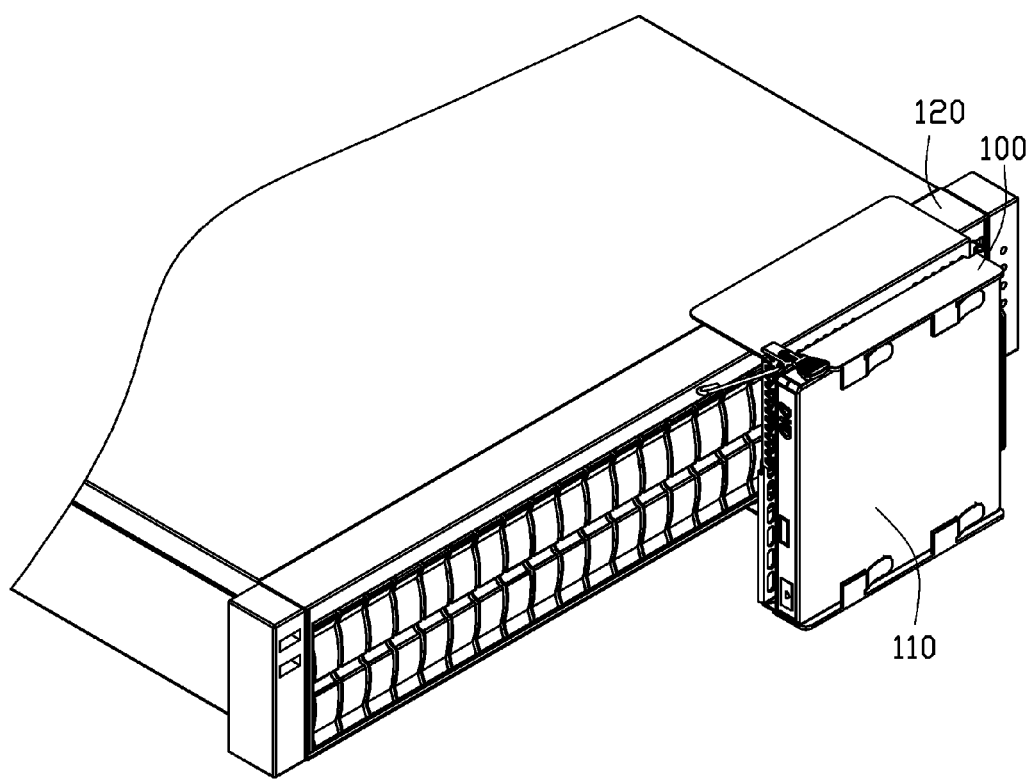
FIG. 1 is an isometric view of a mounting device fixing on a server in accordance with an exemplary embodiment.
Figure 2:
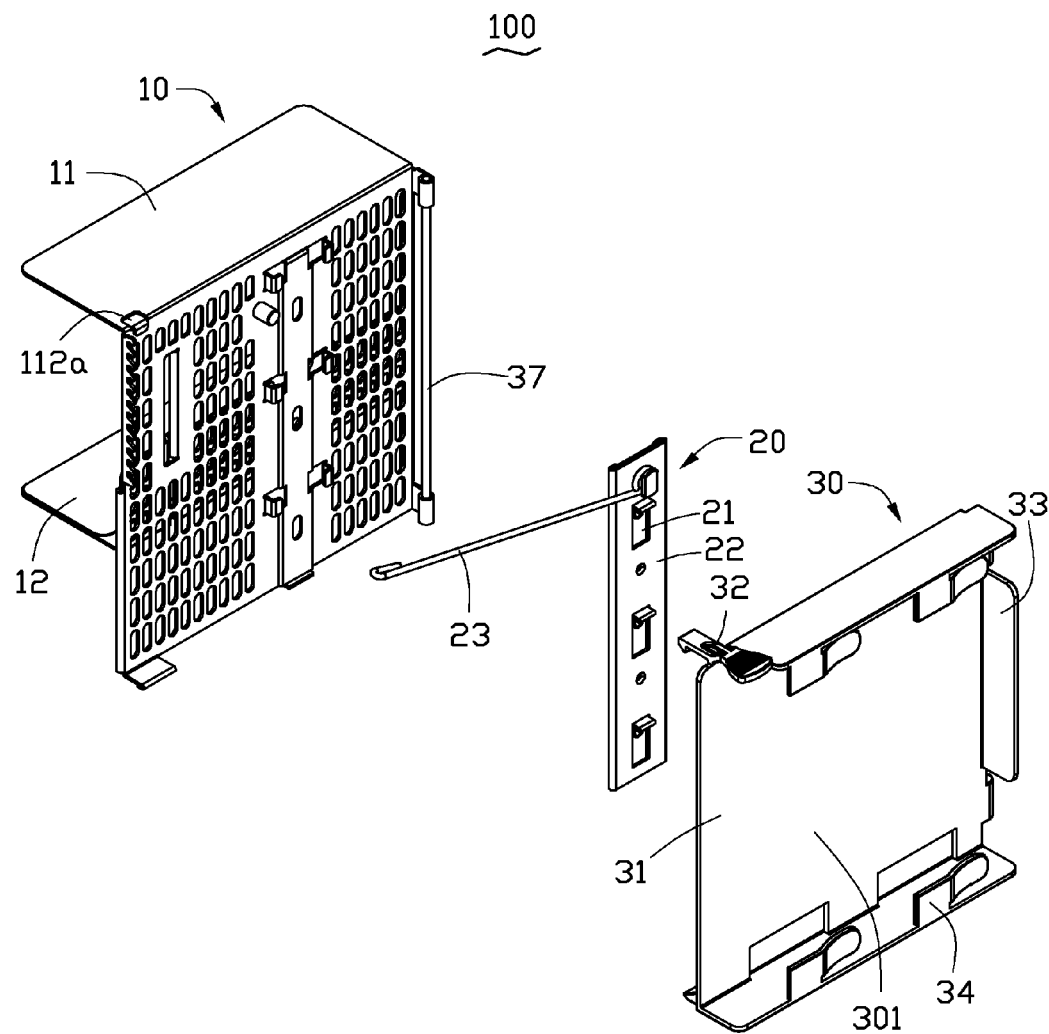
FIG. 2 is an isometric, exploded view of the mounting device of FIG. 1.

Referring to FIGS. 1-2, a mounting device 100, according to an exemplary embodiment, is configured for securing a peripheral device 110 on a server 120. The mounting device 100 includes a clamping device 10, a spacing device 20, and a receiving device 30. In this embodiment, the peripheral device 110 is a CD driver.

Figure 3:
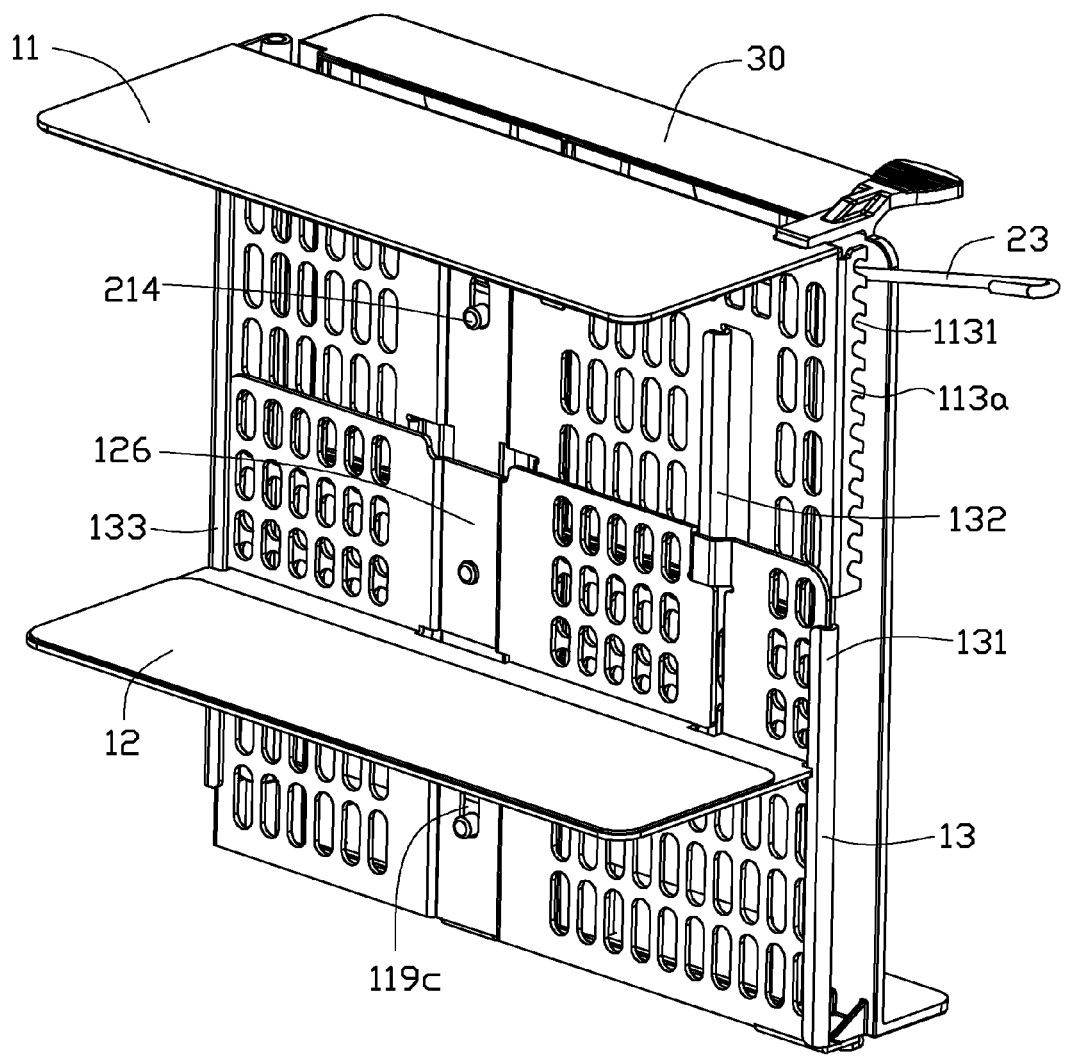
FIG. 3 is an assembled view of the mounting device of FIG. 2.
Figure 4:
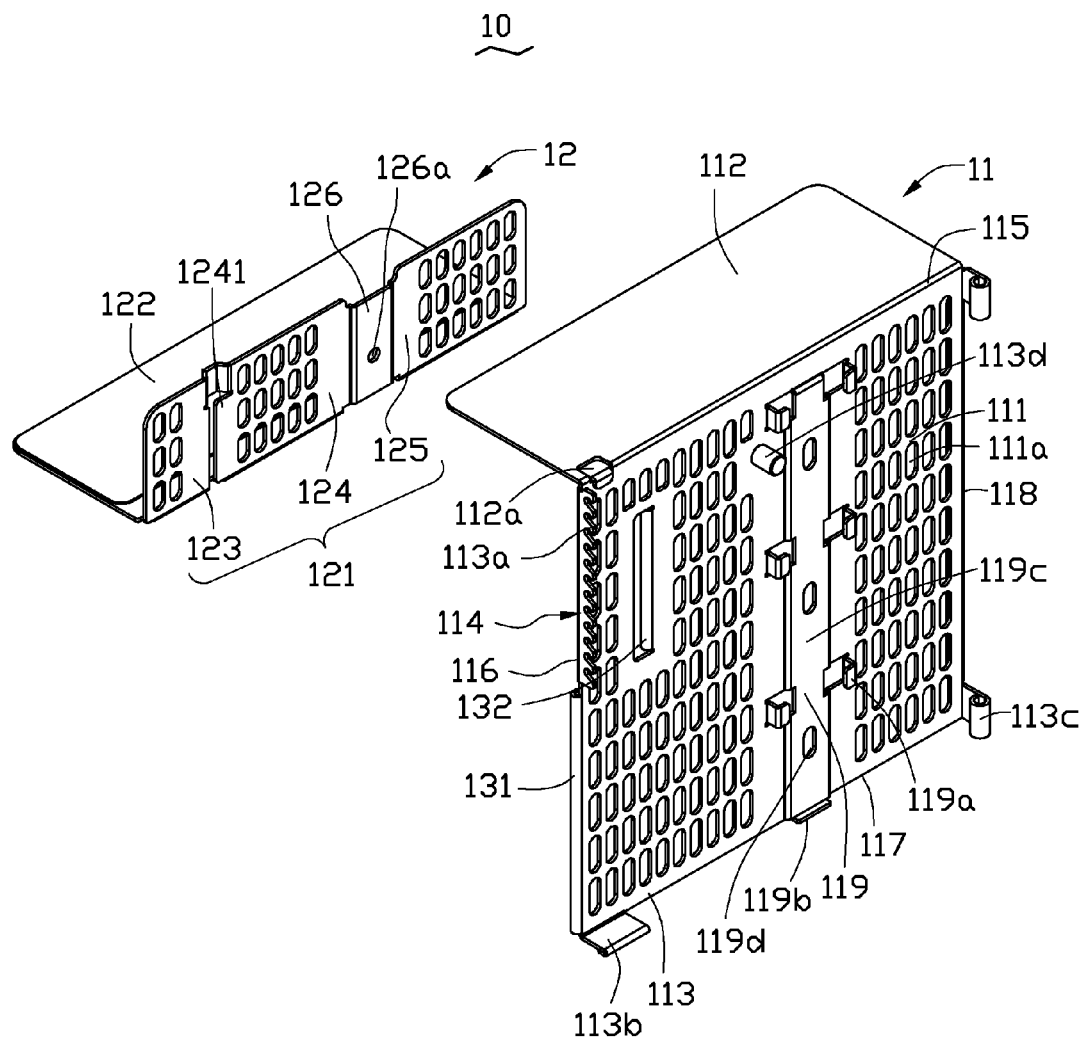
FIG. 4 is an isometric, exploded view of a clamping device of the mounting device of FIG. 2.

Further referring to FIGS. 3-4, the clamping device 10 includes an upper clamping element 11 and a lower clamping element 12. The upper clamping element 11 includes a first side plate 111 and an upper clamping plate 112 perpendicularly positioned on an edge of the first side plate 111. The first side plate 111 is rectangular, and includes a front surface 113, a rear surface 114 opposite to the front surface 113, a first side 115, a second side 116, a third side 117 facing the first side 115, and a fourth side 118 facing the second side 116. The upper clamping plate 112 is positioned on the first side 115 and protrudes up from the rear surface 114. The upper clamping plate 112 defines a fixing hole 112a thereon, generally adjacent to the second side 116. The first side plate 111 defines a guiding element 13 on the rear surface 114 and paralleled to the second side 116. The guiding element 13 includes a first guiding portion 131, a second guiding portion 132 and a third guiding portion 133. The first guiding portion 131 is bent toward the rear surface 114 from the second side 116. The first guiding portion 131 extends from the middle of the second side 116 to the third side 117. The second guiding portion 132 is punched from the front surface 113 to the rear surface 114, and generally adjacent to the second side 116. One end of the second guiding portion 132 is positioned adjacent to the first side 115, and another end of the second guiding portion 132 is positioned adjacent to the middle of the second side 116. The third guiding portion 133 is bent toward the rear surface 114 from the fourth side 118. The third guiding portion 133 extends from the first side 115 to the third side 117. The first, second, and third guiding portions 131, 132, 133 are arranged parallel to each other. A part of the second side 116 adjacent to the first side 115 bends toward the front surface 113 and forms a toothed strip 113a. The toothed strip 113a extends from the first side 115 to the middle of the second side 116, and defines a number of grooves 1131 therein.

A first shielding plate 113b is extended from the third side 117 and a pair of first seats 113c is extended from the fourth side 118. The first shielding plate 113b protrudes up from the front surface 113, generally adjacent to the second side 116. The first seats 113c protrude up from the front surface 113, generally adjacent to the first side 115 and the third side 117 respectively. The first side plate 111 includes a supporting portion 119 on the middle of the front surface 113, and an extending direction of the supporting portion 119 is perpendicular to the first side 115 and the third side 117. The supporting portion 119 includes a number of spacing elements 119a, a second shielding plate 119b positioned on the third side 117, and a supporting plate 119c positioned between the spacing elements 119a and the second shielding plate 119b. The spacing elements 119a are arranged in two lines along the extending direction of the supporting portion 119. The supporting plate 119c is formed on the first side plate 111 by being punched from the rear surface 114 to the front surface 113, and defines a number of position holes 119d thereon. Each of the position holes 119d is strip shaped, and extends along the extending direction of the supporting portion 119. A first pin 113d is extended outward from the front surface 113 of the first side plate 111, and positioned between the toothed strip 113a and the supporting portion 119. The first side plate 111 further defines a number of dissipation holes 111a thereon.

The lower clamping element 12 includes a second side plate 121 and a lower clamping plate 122 perpendicularly positioned at an edge of the second side plate 121. The second side plate 121 includes a first portion 123, a second portion 124, and a third portion 125. The first portion 123, the second portion 124, and the third portion 125 are perpendicularly positioned at the edge of the lower clamping plate 122 respectively. The first portion 123 is spaced from the second portion 124, and the third portion 125 is connected to the second portion 124 via a connecting plate 126. The second portion 124 includes a guiding plate 1241 extended from a side adjacent to the first portion 123. The total width of the second portion 124, the third portion 125, and the connecting plate 126 extending along a longitudinal direction of the second side plate 121 is equal to the distance between the second guiding portion 132 and the third guiding portion 133. The connecting plate 126 defines a spacing hole 126a therethrough.

Figure 5:
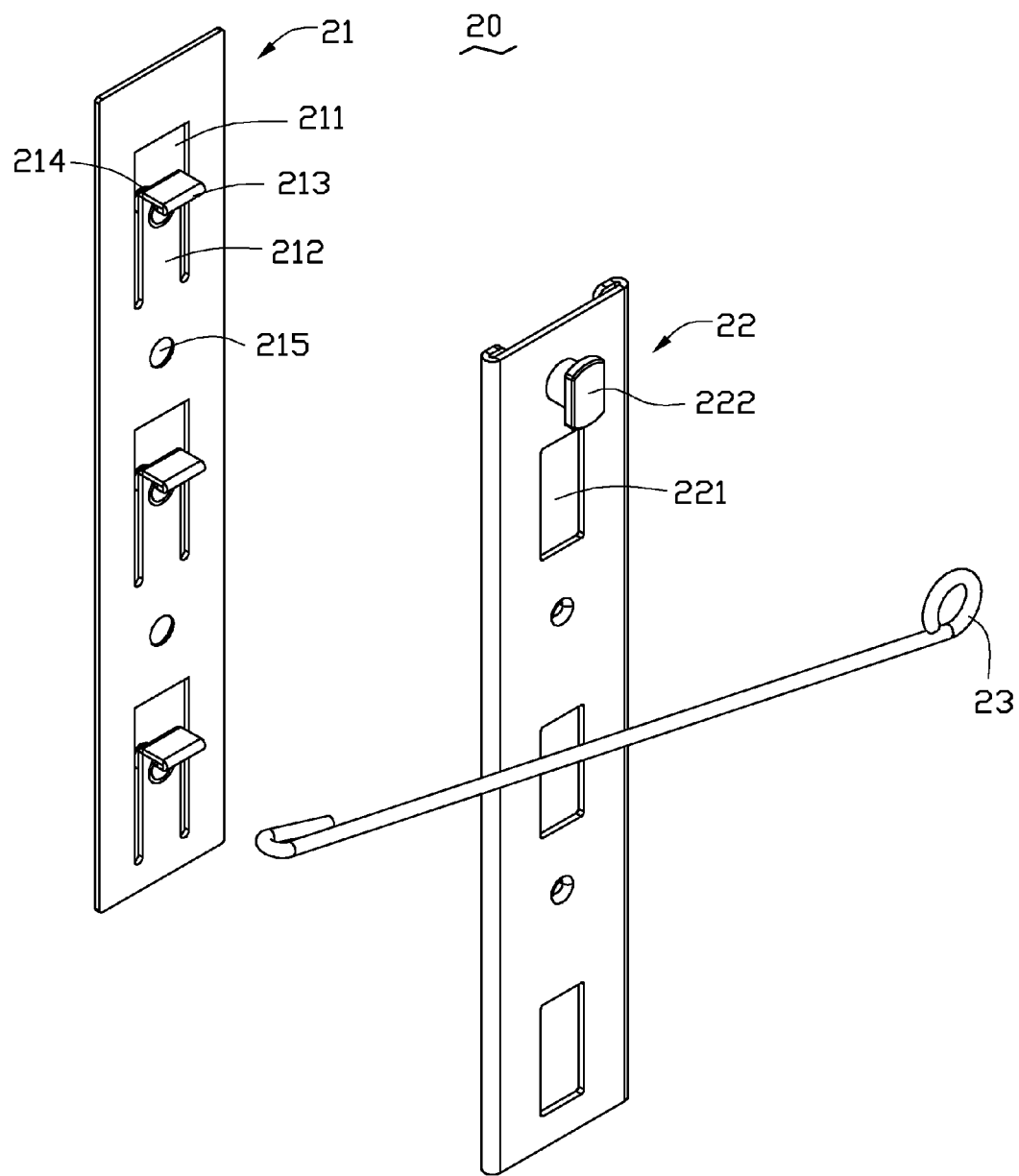
FIG. 5 is an isometric, exploded view of a spacing device of the mounting device of FIG. 2.

Further referring to FIG. 5, the spacing device 20 includes a moving plate 21, a position plate 22, and a lever 23. The moving plate 21 is strip shaped, and defines a number of first through holes 211 along a longitudinal direction thereof. Each of the first through holes 211 is rectangular. A spring plate 212 is extended from a side of each first through hole 211, and extends along the longitudinal direction of the moving plate 21. An operation portion 213 and a position pole 214 are respectively extended from a free end of each spring plate 212. The operation portion 213 and the position pole 214 are positioned on two opposite sides of the spring plate 212. The moving plate 21 defines two round holes 215, with each round hole 215 positioned between each two first through holes 211.

The position plate 22 is strip shaped, and defines a number of second through holes 221 along a longitudinal direction thereof. Each of the second through holes 221 is rectangular. A fixing pole 222 is extended from one side of the position plate 22, generally adjacent to one end of position plate 22. Two second pins (not shown) are extended from the position plate 22, with each second pin positioned between each two second through holes 221. The fixing pole 222 and the second pins are positioned on two opposite sides of the position plate 22. The position plate 22 is assembled on a side of the moving plate 21, with the second pins extending through the round holes 215. The operation portions 213 of the moving plates 21 protrude from the second through holes 221. One end of the lever 23 is fixed on the fixing pole 222.

Figure 6:
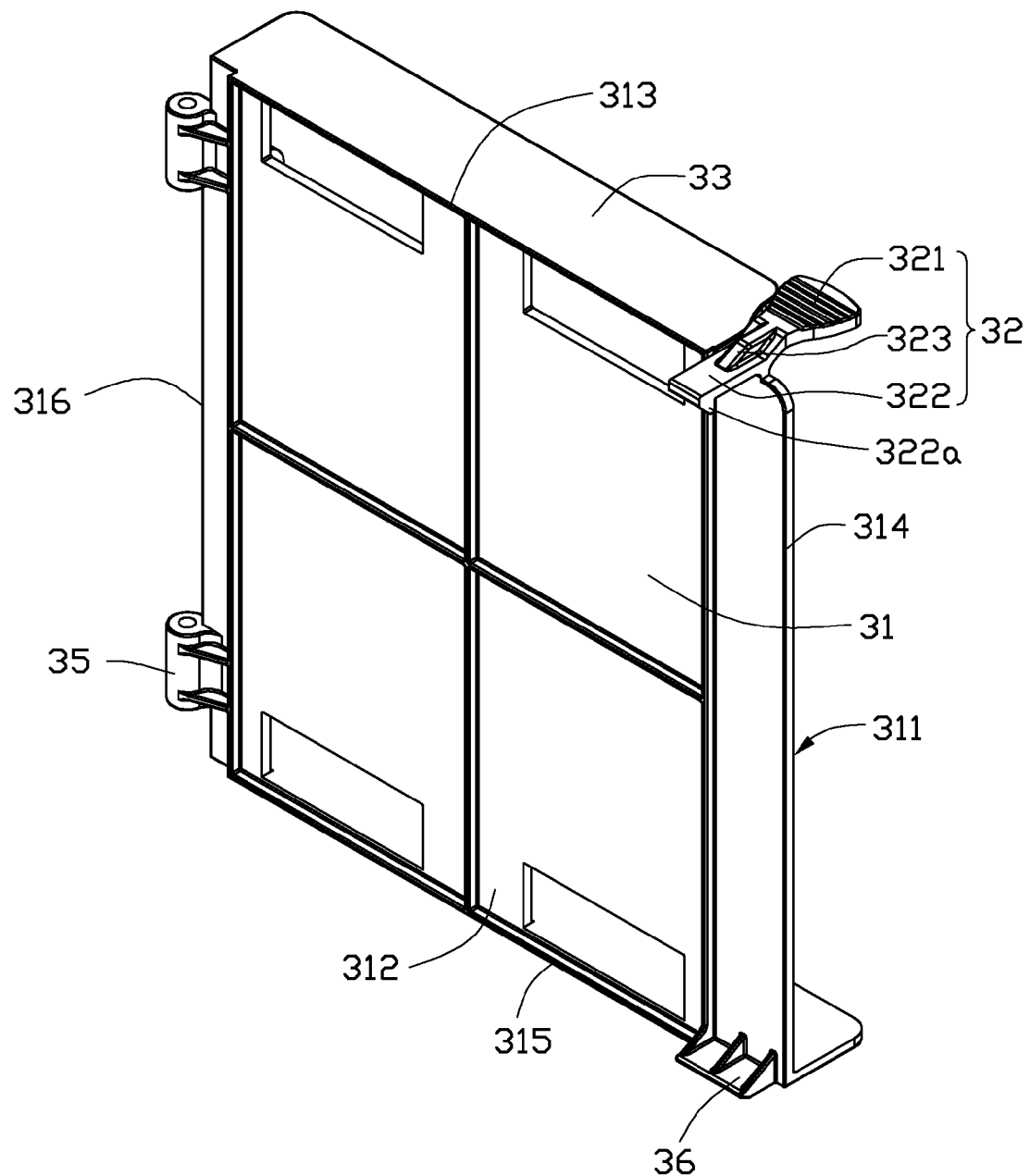
FIG. 6 is an isometric, exploded view of a receiving device of the mounting device of FIG. 2.

Further referring to FIG. 6, the receiving device 30 includes a third side plate 31 and a hook 32. The third side plate 31 is rectangular, and includes a first surface 311, a second surface 312 opposite to the first surface 311, an upper side 313, a left side 314, a lower side 315 facing the upper side 313, and a right side 316 facing the left side 314. Three third shielding plates 33 are extended from the upper side 313, the lower side 315, and the right side 316 of the third side plate 31 respectively. The third shielding plates 33 protrude up from the first surface 311. Two fourth shielding plates 34 are extended from each of the third shielding plates 33 positioned on the upper side 313 and the lower side 315. The fourth shielding plates 34 are parallel with the first surface 311. The third side plate 31, the third shielding plates 33, and the fourth shielding plates 34 cooperatively form a receiving room 301. A pair of second seats 35 is extended from the right side 316 and a spacing block 36 is extended from the lower side 315. The second seats 35 protrude up from the second surface 312, generally adjacent to the upper side 313 and the lower side 315 respectively. The spacing block 36 protrudes up from the second surface 312, generally adjacent to the left side 314. The hook 32 includes a pressing portion 321, a grasping portion 322, a connecting portion 323 connected between the pressing portion 321 and the grasping portion 322. The hook 32 is positioned on the third side plate 31 with the connecting portion 323 connected to the upper side 313, generally adjacent to the left side 314.

In assembly, the spacing device 20 is movably received between the spacing elements 119a of the first side plate 111 from the first side 115. The position poles 214 of the moving plate 21 protrude from the position holes 119d of the supporting plate 119c. One end of the spacing device 20 adjacent to the third side 117 is supported by the second shielding plate 119b. The middle of the lever 23 resists on the first pin 113d of the first side plate 111. The second side plate 121 is slidably received in the guiding element 13. The connecting plate 126 is opposite to the supporting plate 119c, and one of the position poles 214 protrudes from the spacing hole 126a. The receiving device 30 is rotatably assembled on the first side plate 111 by the first seat 113c and the second seat 35 being received on a shaft 37.

Before the mounting device 100 is assembled to a server 120, the distance between the upper clamping plate 112 and the lower clamping plate 122 is adjusted according to the size of the server 120. During adjusting, a user pulls the position pole 214 from the spacing hole 126a, and the lower clamping element 12 is moved relative to the upper clamping element 11. When the lower clamping plate 122 is adjacent to the third side 117, two opposite sides of the second portion 124 and the third portion 125 are guided by the first guiding portion 131 and the third guiding portion 133. When the lower clamping plate 122 is adjacent to the first side 115, two opposite sides of the first portion 123 and the third portion 125 are guided by the third guiding portion 133 and the second guiding portion 132. The guiding plate 1241 of the second portion is received in the second guiding portion 132. The user pushes one of the position poles 214 into the spacing hole 126a when the distance between the upper clamping plate 112 and the lower clamping plate 122 is approximately equal to the height of the server 120.

During use, the mounting device 100 is positioned at an edge of the server 120 by the upper clamping plate 112 and the lower clamping plate 122. The peripheral device 110 is received in the receiving room 301 from the left side 314. The receiving device 30 is rotated to close the first side plate 111 as the spacing block 36 is supported by the first shielding plate 113b. The grasping portion 322 of the hook 32 is locked in the fixing hole 112a. Then, one end of the lever 23 facing away the fixing pole 222 is operated toward the third side 117, and another end of the lever 23 drives the spacing device 20 to move toward the first side 115. The position pole 214 slides in the corresponding position hole 119d along a direction perpendicular to the upper clamping plate 112. The lower clamping element 12 is driven to move toward the upper clamping element 11 by the position hole 119d. When the upper clamping plate 112 and the lower clamping plate 122 clamps the server 120 firmly, the lever 23 is latched in one of the grooves 1131 of the toothed strip 113a. Therefore, the mounting device 100 can be secured on servers 120 with different sizes and supports the peripheral device 110 used with the servers 120.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A mounting device, comprising:
  a clamping device comprising an upper clamping element and a lower clamping element, the upper clamping element comprising a first side plate and an upper clamping plate, the first side plate comprising a front surface and a rear surface, the upper clamping plate perpendicularly positioned on an edge of the rear surface, the first side plate comprising a guiding element on the rear surface and defining a plurality of position holes therethrough, each of the guiding element and the position holes extending along a direction perpendicular to the upper clamping plate, the lower clamping element comprising a second side plate slidably received in the guiding element and a lower clamping plate perpendicularly positioned on an edge of the second side plate, the second side plate defining a spacing hole therethrough, the lower clamping plate being opposite to the upper clamping plate;
  a spacing device positioned on the front surface of the first side plate and comprising a plurality of spring plates, each spring plate comprising a position pole extending from one side thereof, each position pole passing through a corresponding one of the position holes, one of the position poles being received in the spacing hole; and
  a receiving device connected with the first side plate, the receiving device defining a receiving room facing away the first side plate.

2. The mounting device of claim 1, wherein the first side plate comprises a first side, a second side, a third side facing the first side, and a fourth side facing the second side; the upper clamping plate is positioned on the first side.

3. The mounting device of claim 2, wherein the first side plate comprises a toothed strip bending toward the front surface from the second side, the toothed strip extends from the first side to the middle of the second side, the first side plate comprises a first pin projecting from the front surface; the spacing device comprises a lever, one end of the lever is fixed on the spacing device, the middle of the lever resists on the first pin, and the other end is latched in the toothed strip and capable of being operated to drive the spacing device such that each position pole slides in the corresponding position hole along the direction perpendicular to the upper clamping plate.

4. The mounting device of claim 3, wherein the spacing device comprises a moving plate and a position plate; the moving plate defines a plurality of first through holes, each of the spring plates extends from a side of each first through hole, the spring plates extend along a longitudinal direction of the moving plate; each of the position poles is positioned on a side of each spring plate, the position plate is fixed with the moving plate, the position plate comprises a fixing pole facing away the position poles, one end of the lever is fixed on the fixing pole.

5. The mounting device of claim 4, wherein each spring plate comprises an operation portion extending from a free end thereof, the operation portions face away the position poles; the position plate defines a plurality of second through holes corresponding to the first through holes, the operation portions protrude form the second through holes.

6. The mounting device of claim 2, wherein the first side plate comprises a supporting portion receiving the spacing device on the front surface, and an extending direction of the supporting portion is perpendicular to the first side and the third side; the supporting portion comprises a plurality of spacing elements, a shielding plate positioned on the third side, and a supporting plate; the spacing elements are arranged in two lines along the extending direction of the supporting portion, the supporting plate are positioned between the two lines of spacing elements and the shielding plate, the supporting plate contacts the spacing device, the two lines of spacing elements and the shielding plate confines the spacing device, the position holes are defined on the supporting plate.

7. The mounting device of claim 2, wherein the first side plate comprises a pair of first seats extending from the fourth side, the receiving device comprises a pair of second seats extending from one end thereof, the mounting device comprises a shaft, the receiving device is rotatably assembled on the first side plate by the shaft passing through the first seats and the second seats.

8. The mounting device of claim 2, wherein the guiding element comprises a first guiding portion, a second guiding portion and a third guiding portion; the first guiding portion is bent toward the rear surface from the second side, the first guiding portion extends from the middle of the second side to the third side, the second guiding portion is punched from the front surface to the rear surface, one end of the second guiding portion is positioned adjacent to the first side, another end of the second guiding portion is positioned adjacent to the middle of the second side, the third guiding portion is bent toward the rear surface from the fourth side, the third guiding portion extends from the first side to the third side, the first, second and third guiding portions are arranged parallel to each other along a direction perpendicular to the upper clamping plate.

9. The mounting device of claim 8, wherein the second side plate comprises a first portion, a second portion, a third portion, and a connecting plate, the first portion is spaced from the second portion, the third portion is connected to the second portion with the connecting plate, the spacing hole is defined on the connecting plate, the total width of the second portion, the third portion, and the connecting plate along a longitudinal direction of the second side plate is equal to the distant between the third guiding portion and the second guiding portion; when the lower clamping plate is adjacent to the third side, two opposite sides of the second portion and the third portion are guided by the first guiding portion and the third guiding portion; when the lower clamping plate is adjacent to the first side, two opposite sides of the first portion and the third portion are guided by the third guiding portion and the second guiding portion.

10. The mounting device of claim 9, wherein the second portion comprises a guiding plate extended from one side adjacent to the first portion, the guiding plate is received in the second guiding portion.

11. The mounting device of claim 1, wherein each of the position holes is strip shaped.

* * * * *